United States Patent [19]
Lin

[11] Patent Number: 6,130,919
[45] Date of Patent: Oct. 10, 2000

[54] METHOD AND DEVICE FOR DIGITAL FREQUENCY MODULATION

[76] Inventor: Ming-I Lin, 5F, No. 52, Liu Chang St., San Chung Shih, Taipai Hsien, Taiwan

[21] Appl. No.: 09/217,523

[22] Filed: Dec. 21, 1998

[51] Int. Cl.[7] ............................. H03C 3/00; H04N 3/14
[52] U.S. Cl. ......................... 375/302; 348/441; 332/119
[58] Field of Search ................... 375/239, 295, 375/271, 302; 332/117, 119; 348/441, 724, 723

[56] References Cited

U.S. PATENT DOCUMENTS 5,566,207  10/1996  O'Donnell ................ 375/239

*Primary Examiner*—Tesfaldet Bocure
*Attorney, Agent, or Firm*—Alan Kamrath; Oppenheimer Wolff & Donnelly LLP

[57] ABSTRACT

A method and device are adapted to perform digital frequency modulation. First, an input frequency modulation signal is converted into a digital signal via an A/D (Analog/Digit) adapter, then a varied carrier frequency parameter "a" for each different system is added to the digital signal by an adder; next, the digital signal is multiplied by a various frequency variation parameter "b" assigned to each different system accordingly, and is further multiplied by another number $2^{-U}$, U=10 for SVHS system and U=11 for VHS system, by a multiplier; afterwards, the digital signal is processed by a digital integrator; then corresponding amplitudes in mapping with all angles θ and θ' within 360 degrees are obtained by sinθ ROM and Cosθ' ROM, wherein $Z^{-1}$ is a flip-flop, the parameters "a", "b" are variable corresponding to specifications of PAL, NTSC, VHS, SVHS systems and the interlace scanning so as to make the design applicable to various systems.

14 Claims, 4 Drawing Sheets

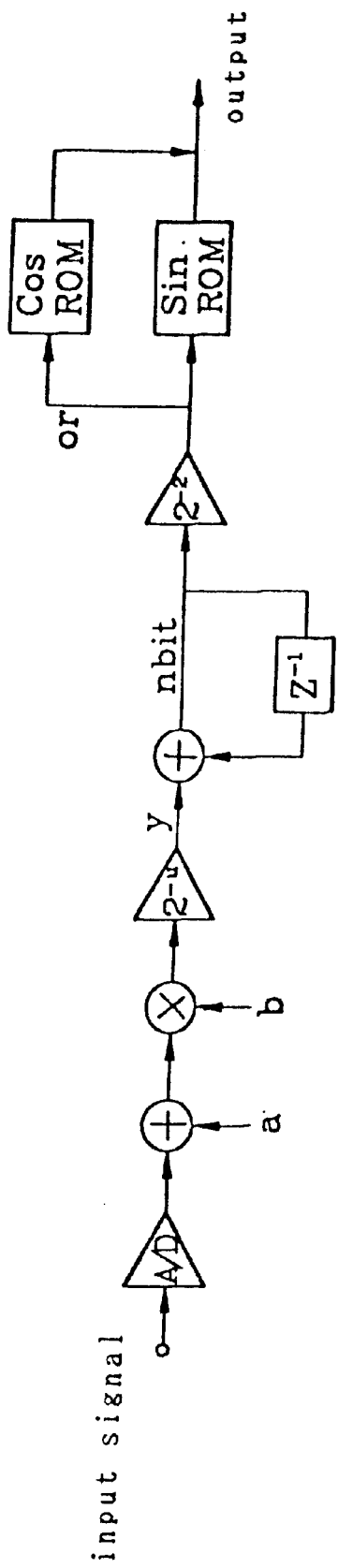
F I G. 2

METHOD AND DEVICE FOR DIGITAL FREQUENCY MODULATION

BACKGROUND OF THE INVENTION

The present invention relates to a method and device for performing digital frequency modulation. First, an input frequency modulation signal is converted into a digital signal via an A/D (Analogue/Digit) adapter, then a varied carrier frequency parameter "a" for each different system is added to the digital signal by an adder; next, the digital signal is multiplied by a various frequency variation parameter "b" assigned to each different system accordingly, and is further multiplied by another number $2^{-U}$, U=10 for SVHS system and U=11 for VHS system, by a multiplier; afterwards, the digital signal is processed by a digital integrator; then corresponding amplitudes in mapping with all angles θ and θ' within 360 degrees are obtained by sinθ ROM and Cosθ' ROM, wherein $Z^{-1}$ is a flip-flop, the parameters "a", "b" are variable as a result of the difference in specifications of PAL, NTSC, VHS, SVHS systems and the interlace scanning so as to make the design applicable to various systems.

1. Field of the Invention

The present invention is particularly related to a method and device to reduce noise by means of digital processing of frequency modulation to integrate the image systems, such as NTSC, PAL, VHS, SVHS video recording and playing systems into a single system.

2. Related Prior Art

Conventionally, to integrate an image system, such as NTSC, PAL, VHS, SVHS video recording and playing system into a single system, it is usually designed in a bulky analogue type dimension, and the system is subject to noise interference. That is to say that the analogue type frequency modulation takes up larger space and is rather difficult to be integrated, especially difficult in control of the resolution ratio. It is particularly vital to take account of space and resistance of interference in design especially involving two or more systems so as to minimize the interference of noise signals.

Moreover, in international markets involved in a fast globalized economic system nowadays, the analogue type frequency modulation art is gradually losing its edge in competition due to the consideration of compatibility among various systems in countries all over the world which becomes unavoidable in international cooperation designs, and commercial trades and fast price drops as a result of competition on markets, and the spread of the idea of "system on chip" in the development of IC designs.

Besides, the processing of signals by an analogue type IC is not compatible with the digitalized IC designs in current and future trends. When an analogue type IC is to be integrated with a digital IC, the analogue circuit can interfere with the digital system in one aspect; and the mass production of IC components today is not supported by effective analogue testing equipment in another aspect.

To cope with the drop of price in digital IC components nowadays, an art of combining DSP (digital signal processing) and ROM to process frequency modulation and integrate various image/video recording and playing systems is developed. It intends not only to reduce the noise interference but also to increase the competitive edge of the products on markets by cutting the size and cost of commercial products.

SUMMARY OF THE INVENTION

Therefore, the primary object of the present invention is to provide a method and device of digital frequency modulation to integrate NTSC, PAL, VHS, SVHS video recording and playing systems into a single system wherein symmetry of ROM of Sin(θ) or Cos(θ') is used to reduce the gate counts of IC components to only one fourth of the originally needed gate counts.

Another object of the present invention is to provide a method of frequency modulation, which includes the following steps:

1. converting an input FM signal into a digital signal;
2. adding a various carrier frequency parameter "a" to the digital signal responsive to different systems so as to make it operable in each system;
3. multiplying the digital signal with a different frequency variation parameter "b" responsive to various systems;
4. multiplying the digital signal with $2^{-U}$ in order to cut the needed storage space of a ROM; U=10 in a SVHS system and U=11 in a VHS system;
5. then processing the digital signal with a digital integrator to obtain a VCO (voltage controlled oscillation) signal (θ);
6. using the ROM of Sin(α) $0 \leq \alpha \leq \pi/2$, to calculate all the corresponding amplitudes to angles of θ within the 360 degrees of angle; and
7. using the ROM of Cos(β), $0 \leq \beta \leq \pi/2$, to calculate all the corresponding FM amplitudes to angles of θ' within the 360 degrees of angle to convert the amplitude signals into FM waves.

Wherein the carrier parameter $$"a" = \frac{X_w \cdot f_s - X_s \cdot f_w}{f_w - f_s}$$

FM variation parameter $$"b" = 2^n T\left(\frac{f_w - f_s}{X_w - X_s}\right)$$

$X_s$ is the criterion level of a sync signal, $f_s$ is the frequency of a sync signal; $X_w$ is the criterion level of a white signal; $f_w$ is the frequency of the white signal; n is the number of digital bits used; T is the period of a clock cycle. The different systems involved are NTSC, PAL, VHS, SVHS recording and playing systems.

One further object of the present invention is to provide a digital FM device, which comprises:

an analogue/digit (A/D) adapter to convert an input FM signal into a digital signal;
an adder to add a various carrier frequency parameter "a" assigned to each different system to the digital signal;
a multiplier to get the digital signal multiplied by a various frequency variation parameter "b" assigned to each different system and multiplying the digital signal with $2^{-U}$, and U=10 in the SVHS system, U=11 in the VHS system;
a ROM for Sin(α), used to obtain a corresponding amplitude for each θ in whole 360 degrees by way of $0 \leq \alpha \leq \pi/2$;
a ROM for Cos(β), used to obtain a corresponding FM amplitude for each θ' in whole 360 degrees by way of $0 \leq \beta \leq \pi/2$;
wherein the parameter $$a = \frac{X_w \cdot f_s - X_s \cdot f_w}{f_w - f_s}$$

and parameter $$b = 2^n T\left(\frac{f_w - f_s}{X_w - X_s}\right)$$

($X_s$ is the criterion level of a sync signal, $f_s$ is the frequency of a sync signal, $X_w$ is the criterion level of a white signal, $f_w$ is the frequency of the white signal, n is the number of digital bits used, T is the period of a time pulse), and the various systems including the NTSC, PAL image systems and VHS, SVHS video recording and playing systems.

BRIEF DESCRIPTION OF THE DRAWINGS

FIG. 2 is a flow chart showing the process of the digital frequency modulation method and device of the present invention;

DETAILED DESCRIPTION OF THE PREFERRED EMBODIMENTS

Figure 1A:
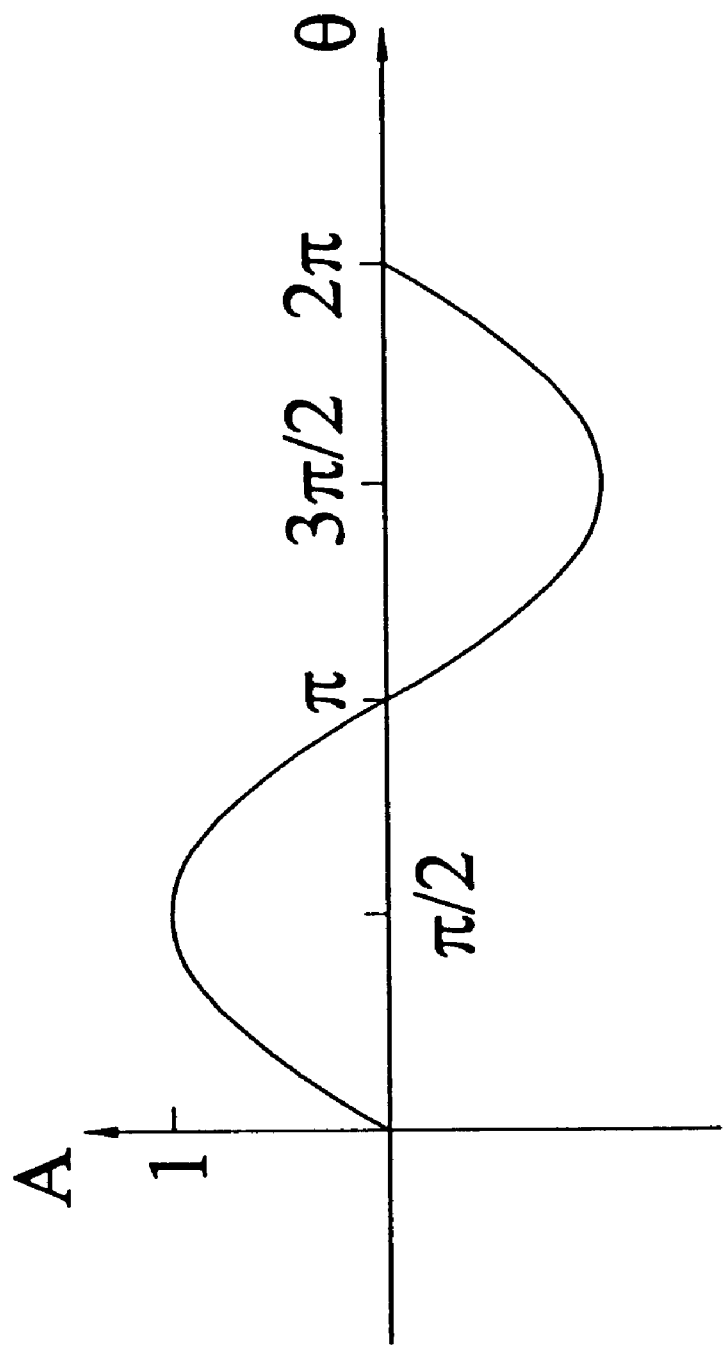
FIGS. 1(a) and 1(b) are diagrams showing the individual relationship of θ of Sinθ ROM and Cosθ ROM with respect to the corresponding amplitude.
Figure 1B:
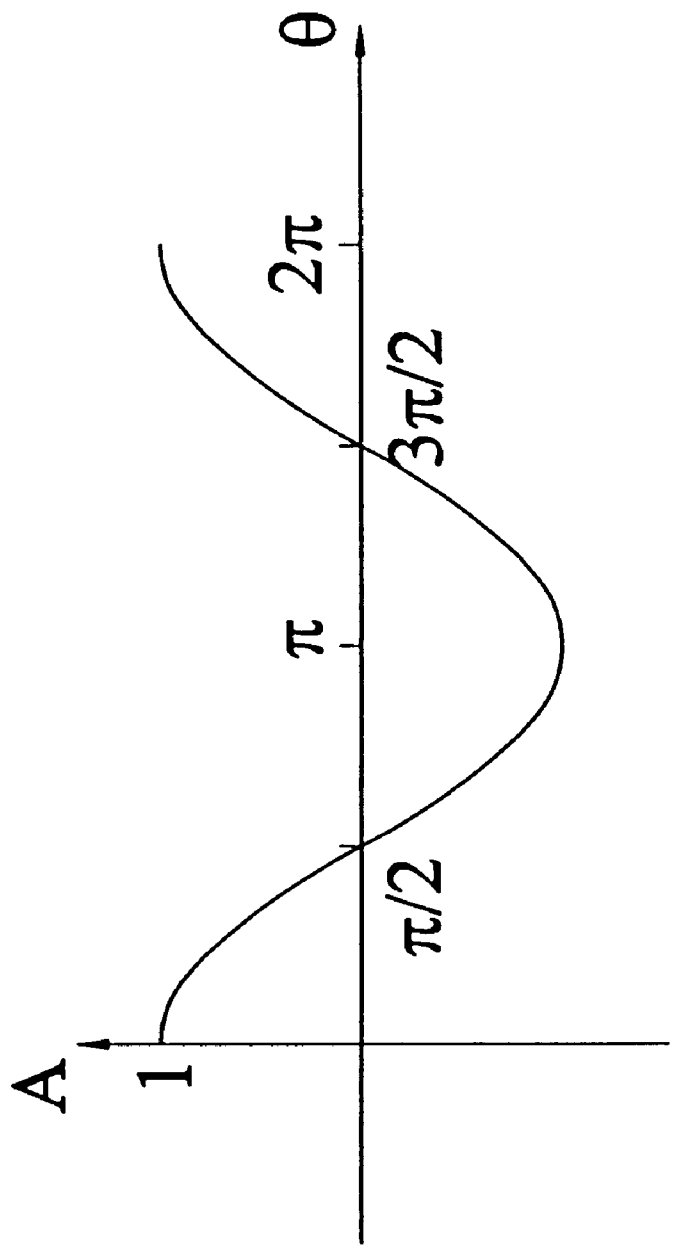

Referring to FIGS. 1(a), 1(b), the gate count in an IC design can be reduced to only one fourth of the original needed gate count as a result of the use of symmetric properties of Sin and Cos ROM, for example, (A) In Sinθ ROM, the amplitude A can be obtained from a known θ, i.e., as $0 \leq \theta \leq \pi/2$, A=Sinθ=Sinα, $0 \leq \alpha \leq \pi/2$
as $\pi/2 \leq \theta \leq \pi$, A=Sinθ=Sin(π-α)=Sinα, $0 \leq \alpha \leq \pi/2$
as $\pi \leq \theta \leq 3\pi/2$, A=Sinθ=-Sin(θ-π)=-Sinα, $0 \leq \alpha \leq \pi/2$
as $3/2\pi \leq \theta \leq 2\pi$, A=Sinθ=-Sin(2π-θ)=-Sinα, $0 \leq \alpha \leq \pi/2$ As described above, all the corresponding amplitude values of angles θ, $0 \leq \alpha \leq \pi/2$, can be expressed by Sinα ROM, and A indicates an amplitude value;

(B) in Cosθ ROM, amplitude values can be obtained from known θ, i.e., as $0 \leq \theta' \leq \pi/2$, A'=Cosθ'=Cosβ, $0 \leq \beta \leq \pi/2$
As $\pi/2 \leq \theta' \leq \pi$, A'=Cosθ'=-Cos(π-θ')=-Cosβ, $0 \leq \beta \leq \pi/2$
As $\pi \leq \theta' \leq 3\pi/2$, A'=Cosθ'=-Cos(θ'-π)=-Cosβ, $0 \leq \beta \leq \pi/2$
As $3/2\pi \leq \theta' \leq 2\pi$, A'=Cosθ'=Cos(2π-θ')=Cosβ, $0 \leq \beta \leq \pi/2$ As described above, the amplitudes of all corresponding θ' can be expressed by Cosβ ROM, wherein $0 \leq \beta \leq \pi/2$ and A' stands for an amplitude. Thereby, the symmetries of Sin and Cos ROM in the above (A) and (B) makes it possible to use only one fourth of ROM size to obtain a desired amplitude.

As shown in the process flow chart of FIG. 2, the method and device for digital frequency modulation according to the present invention are illustrated. First, an input frequency modulation signal is converted into a digital signal via an A/D (Analogue/Digit) adapter, then a varied parameter "a" for each different carrier wave is added to the digital signal in conformance to different systems by an adder; next, the digital signal is multiplied by a various frequency variation parameter "b" assigned to each different system accordingly, and is further multiplied by another number $2^{-U}$, U=10 for SVHS system and U=11 for VHS, by a multiplier; afterwards, the digital signal is processed by a digital integrator; then corresponding amplitudes in mapping with all angles θ,θ within 360 degrees are obtained by sinθ ROM and Cosθ' ROM, wherein $Z^{-1}$ is a-flip-flap. In short, in a frequency modulation (FM), a basic carrier frequency is added with a parameter "a" and then multiplied by a parameter "b" to obtain a minimum frequency variation value; obtained FM signals are processed via a VOC (voltage control oscillator) to acquire angles θ and θ' mapping to a table in order to find the corresponding amplitudes.

As is described in detail below, if the oscillation frequency of the VCO is f, and an n-bit IC is used, wherein the period of a time pulse of the IC is T (in the present case, it is 1/28.6 MHz), as the node y in FIG. 3:

y (the value of a signal before oscillation of VCO)/$2^n$=f/1/T $$y = 2^n T \cdot f = (x+a)b \quad (1)$$

if the criterion level of the sync signal of brightness is $X_s$, the frequency of the criterion level of the sync signal is $f_s$, the criterion level of a white signal is $X_w$, the frequency of the white signal is $f_w$, substitute them into the equation (1) to obtain:

$$2^n \cdot T \cdot f_s = b \cdot S_s + a \, b \quad (2)$$

$$2^n \cdot T \cdot f_w = b \cdot X_w + a \, b \quad (3)$$

from equations (2), (3), the following formula can be obtained:

$$a = \left(\frac{1}{b}\right) 2^n T \left(\frac{X_w \cdot f_s - X_s \cdot f_w}{X_w - X_s}\right) = \frac{X_w \cdot f_s - X_s \cdot f_w}{f_w - f_s} \quad (4)$$

$$b = 2^n T \left(\frac{f_w - f_s}{X_w - X_s}\right) \quad (5)$$

It is known from equation (5), the larger the value of b, the more bits it takes then the resolution ratio is higher and the S/N noise ratio is better. When b>1, the S/N inferiority level is within 3 dB. For instance, if b>1 in the SVHS system, the difference between the frequencies of a white signal and a sync signal is 1.6 MHz according to the system specification of the SHS, and the set difference of the criterion level is 200, i.e., $f_w - f_s = 1.6$ MHz, $X_w - X_s = 200$; the frequency of the IC is 28.6 MHz, so when T=1/28.6 MHz, n>11.8.

If b>1 in a VHS system, the difference between the frequencies of a white signal and a sync signal is 1.0 MHz according to the system specification of the VHS, and the set difference of the criterion level is 200, i.e., $f_w - f_s = 1.0$ MHz, $X_w - X_s = 200$; the frequency of the IC is 28.6 MHz, T=1/28.6 MHz, n>12.5. Thereby the bit number is set as 13, the inferiority level of S/N can be kept less than 3 dB. So, the input oscillation frequency signal of VCO is 12 bits.

It can be known from equation (5):

$$\Delta f = f_w - f_s = \frac{X_w - X_s}{2^n T} \cdot b = \frac{200}{2^{13} \cdot 1/28.6 \, \text{MHz}} \cdot b = 0.6982 \, \text{MHz},$$

In a SVHS system, in a digital system design, b=2.3=2+X/64, $$\Delta f = 1.6 = 1.39648 + 0.010910 \cdot X, \text{ so } X=19 \quad (6)$$

In the VHS case, in a digital system design, b=1/0.69=1+X/128, $$\Delta f = 1.0 = 0.69825 + 0.005455 \cdot X, \text{ so } X=55 \quad (7)$$

In the SVHS case, X=19, the frequency difference of a white signal and a sync signal Δ f=1.604 MHz in the practical design; in the VHS case, X=55, the frequency difference of a white signal and a sync signal Δf=0.998 MHz in the practical design.

As indicated in equation (4):

$$a = \frac{X_w \cdot f_s - X_s \cdot f_w}{f_w - f_s} = \frac{X_w \cdot f_s - X_s \cdot (f_w - f_s + f_s)}{f_w - f_s} = \frac{(X_w - X_s) \cdot f_s}{\Delta f} - X_s \quad (8)$$

if $X_s$=392 is used as an input criterion level of a white signal it can be obtained from equations (6) and (7), in case of the SVHS of NTSC/PAL system, the frequency difference of the white signal and sync signal in the design is Δf=1.604 MHz, the corresponding frequency value of the criterion level of a sync signal is set $f_s$=5.4 MHz, it can be a=281.

In case of the VHS of NTSC systems, the frequency difference of the white signal and sync signal in the design is Δf=0.998 MHz, the corresponding frequency value of the criterion level of a sync signal is $f_s$=3.5 MHz, it can get a=306.

In the case of VHS of PAL system, the frequency difference of the white signal and sync signal in the design is Δf=0.998 MHz, the corresponding frequency value of the criterion level of a sync signal is $f_s$=3.9 MHz, it can get a=390.

Then, using the so obtained "a" value to get $f_s$ through calculation, $f_s$=5.397 MHz for the SVHS of NTSC/PAL system $f_s$=3.483 MHz for the VHS of NTSC system $f_s$=3.902 MHz for the VHS of PAL system Therefore, as "a"<$2^9$−1, the value of a is 281 in the SVHS of NTSC/PAL system, the value of a is 306 for the VHS of NTSC system and the value of a is 390 for the VHS of PAL system. The value of "a" can be simply expressed in a binary digit less than 9 bits. In consideration of interlace, the value of parameter "a" can be obtained from equation (8):

$$a = \frac{(X_w - X_s) \cdot f_s}{\Delta f} - X_s$$

$$a' = \frac{(X_w - X_s) \cdot f_s'}{\Delta f} - X_s$$

$$f_s' - f_s = \frac{\Delta f}{X_w X_s}(a' - a) = \frac{f_h}{2} \text{ ($f_h$ is the horizontal scanning frequency)}$$

$$a' - a = \frac{(X_w - X_s) \cdot f_h}{2\Delta f}$$

Figure 3:
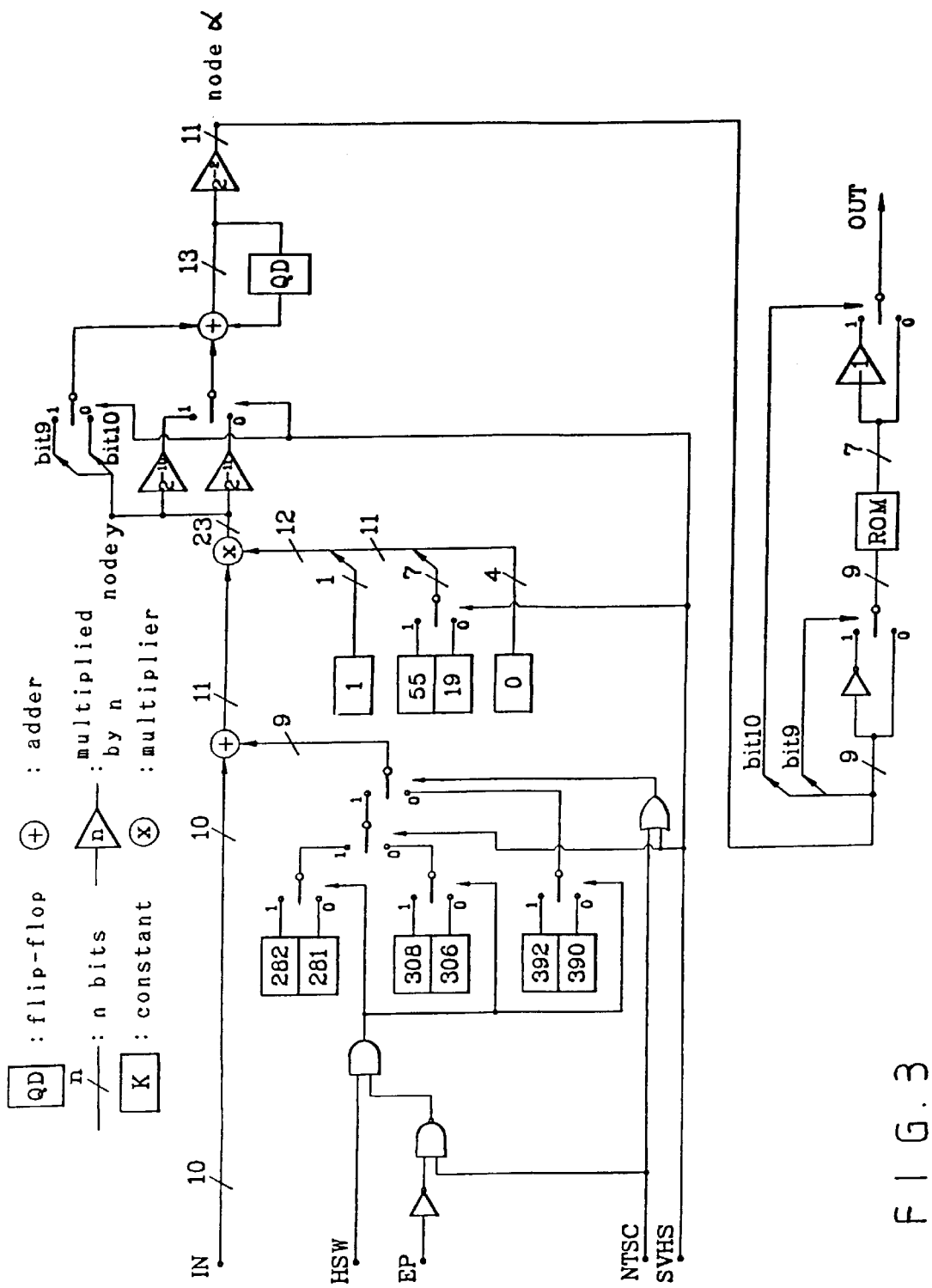
FIG. 3 is a block diagram for the circuit in FIG. 2.

The value of $f_h$=15.832 KHz in the NTSC system, $f_h$=15.625 KHz in the PAL system, so it can be obtained
in the NTSC/SVHS system, a'−a=1, a'=282, $f_s'$−$f_s$=0.5$f_h$,
in the NTSC/VHS system, a'−a=1, a'=308, $f_s'$−$f_s$=0.63$f_h$,
in the PAL/SVHS system, a'−a=1, a+=282, $f_s'$−$f_s$=0.51$f_h$,
in the PAL/VHS system, a'−a=2, a'=392, $f_s'$−$f_s$=0.63$f_h$, As shown in FIG. 3, wherein the control signals are:
NTSC: at Hi (high criterion level) is a NTSC signal, at Lo (low criterion level) is a PAL signal;
SVHS: at Hi ( high criterion level) is a SVHS signal, at Lo (low criterion level) is a VHS signal;
HSW: at Hi (high criterion level), the parameter of interlace scanning parameter will then be used, i.e. the a' parameter.
EP: is zero for general modes.

First, the carrier frequency of an input FM signal y is added with the carrier frequency parameter "a" (in case of interlace scanning, the carrier frequency parameter a' is added), then the sum is further multiplied by a parameter "b", and the parameters "a", "b" are assigned to various systems by the above cited control signals, and their values are variable according to the following different systems:

|  |  | a | a' | B | $2^{-U}$ |
|---|---|---|---|---|---|
| SVHS | NTSC/PAL | 281 | 282 | 2 + 19/64 | $2^{-10}$ |
| VHS | NTSC | 306 | 308 | 1 + 55/128 | $2^{-11}$ |
|  | PAL | 390 | 392 | 1 + 55/128 | $2^{-11}$ |

When multiplied by parameter b, it is referred to equations (6) and (7) and applied to the digital signal processing:

For the SVHS system, $$b = 100100110000 \times 2^{-10}$$
$$= 2 + 19/64$$

For the VHS system, in a digital signal processing:

$$B = 101101110000 \times 2^{-11}$$
$$= 1 + 55/128$$

In brief, determining the values of parameters a, b for various systems and they are multiplied by different values of $2^{-U}$ for different systems, for instance, in the SVHS system it is multiplied by $2^{-10}$ and in the VHS system multiplied by $2^{-11}$ so as to obtain different parameter values for b applied to SVHS or VHS systems respectively.

Furthermore, taking advantage of the symmetry of the ROM of Sin or Cos functions, the node α in FIG. 3 is a 11-bit digit (from bit 0 to bit 10 bits), wherein the 10th bit determines the positive or negative value of the sin ROM output, and the 9th bit is used to determine the symmetry of sin ROM, and the bit 0 to 8 determine the corresponding address in ROM. By inputting such addresses one by one into the ROM, one can obtain the sequential FM amplitudes, and the ROM can be reduced of its size to only ¼ of its original size to get identical precision in design.

As described above, the respective parameters of the present invention can be changed and the number of bits can be increased in such a manner that the resolution ratio and noise signal ratio S/N can be accordingly advanced in response.

It is clearly understood that the present invention can be modified, changed and adjusted to apply to other frequency modulation related fields, but all these changes made should be explained on the basis and its equivalents claimed in the attached claims.

I claim:

1. A method of performing digital frequency modulation (FM), comprising:
   a. converting an input FM signal into a first digital signal;
   b. adding a various carrier frequency parameter "a" to the first digital signal to obtain a second digital signal responsive to different systems so as to make it operable in each system;
   c. multiplying the second digital signal with a different frequency variation parameter b responsive to various systems to obtain a third digital signal;
   d. multiplying the third digital signal with $2^{-U}$ in order to cut the needed storage space of a ROM to obtain a fourth digital signal; U=10 in a SVHS system and U=11 in a VHS system;

e. then processing the fourth digital signal with a digital integrator to obtain VCO (voltage controlled oscillation) signals θ,θ';

f. using the ROM of Sin(α), θ≦α≦π/2, to calculate all the corresponding amplitudes of angles θ within the 360 degrees of angle; and g. using the ROM of Cos(β), θ≦β≦π/2, to calculate all the corresponding FM amplitudes of angles θ';

wherein said carrier parameter $$a = \frac{X_w \cdot f_s - X_s \cdot f_w}{f_w - f_s}$$

and the FM variation parameter $$b = 2^n T\left(\frac{f_w - f_s}{X_w - X_s}\right)$$

($X_s$ is the criterion level of a sync signal, $f_s$ is the frequency of a sync signal, $X_w$ is the criterion level of a white signal, $f_w$ is the frequency of the white signal, n is the number of bits used, T is the period of a clock cycle); wherein the different systems involved are NTSC, PAL, VHS, SVHS recording and playing systems.

2. The method of performing digital frequency modulation as claimed in claim 1 wherein the ROM of Sin(α), θ≦α≦π/2, is used to obtain corresponding amplitudes of all angles of θ in the following manner:

as 0≦θ≦π/2, A=Sinθ=Sinα, θ≦α≦π/2 as π/2≦θ≦π, A=Sinθ=Sin(π−α)=Sinα, θ≦α≦π/2 as π≦θ≦3/2π, A=Sinθ=−Sin(θ−π)=−Sinα, θ≦α≦π/2 as 3/2π≦θ≦2π, A=Sinθ=−Sin(2π−θ)=−Sinα, θ≦α≦π/2 whereby all the amplitudes A corresponding to angles θ can be expressed by Sinα ROM; and by the same means, $Sin^{-1}$ A ROM can be shrunk into a quarter.

3. The method as claimed in claim 1 wherein the ROM of Cos(β), 0≦β≦π/2, is used to obtain corresponding amplitudes of all the angles of θ' in the following manner:

as 0≦θ'≦π/2, A'=Cosθ'=Cosβ, 0≦β≦π/2 as π/2≦θ'≦π, A'=Cosθ'=−Cos(π−θ')=−Cosβ, 0≦β≦π/2 as π≦θ'≦3/2π, A'=Cosθ'=−Cos(θ'−π)=−Cosβ, 0≦β≦π/2 as 3/2π≦θ'≦2π, A'=Cosθ'=Cos(2π−θ')=Cosβ, 0≦β≦π/2 whereby the amplitudes of all corresponding θ' can be expressed by Cosβ ROM, wherein θ≦β≦π/2 and A' stands for an amplitude; and by the same means, $Cos^{-1}$ A' ROM can be shrunk into a quarter.

4. A device for performing digital frequency modulation, comprising, in combination:

an analogue/digit (A/D) adapter to convert an input FM signal into a first digital signal;

an adder to add a various carrier frequency parameter "a" assigned to each different system to the first digital signal to obtain a second digital signal;

a multiplier to multiply the second digital signal by a various frequency variation parameter "b" assigned to each different system to obtain a third digital signal, i.e., multiplying the second digital signal with $2^{-U}$, and U=10 in the SVHS system, U=11 in the VHS system;

a ROM for Sin(α), used to obtain a corresponding amplitude for all angles θ by way of θ≦α≦π/2; and a ROM for Cos(β), used to obtain a corresponding amplitude for all angles θ' by way of θ≦β≦π/2;

wherein the carrier frequency parameter $$a = \frac{X_w \cdot f_s - X_s \cdot f_w}{f_w - f_s}$$

and the frequency variation parameter $$b = 2^n T\left(\frac{f_w - f_s}{X_w - X_s}\right)$$

($X_s$ is the criterion level of a sync signal, $f_s$ is the frequency of a sync signal, $X_w$ is the criterion level of a white signal, $f_w$ is the frequency of the white signal, n is the number of bits used, T is the period of a clock cycle), and wherein the various systems include NTSC, PAL, VHS, SVHS video recording and playing systems.

5. A method of performing digital frequency modulation (FM), comprising:

a. converting an input signal into a first digital signal;

b. adding a various carrier frequency parameter "a" to said first digital signal to obtain a second digital signal responsive to different operating systems, NTSC, PAL, VHS and SVHS, so as to make said second digital signal operable in each said operating system accordingly;

c. multiplying said second digital signal with a frequency variation parameter "b" which is different, responsive to various operating systems, to obtain a third digital signal;

d. then processing said third digital signal by means of a digital integrator to obtain VCO (voltage controlled oscillation) signals θ;

e. using θ as the address to refer to the sin(α) memory or ROM to get the amplitude, A, of the modulated signal to save the gate count using only 0≦α≦π/2, of Sin(α) memory or ROM to calculate all the corresponding amplitudes of angles θ within the 2π radian by inverting the output of ROM or memory, offset the input θ or both; and f. using θ as the address to refer to the Cos(β) memory or ROM to get the amplitude, A, of the modulated signal to save the gate count using only 0≦α≦π/2, of Cos(β) memory or ROM to calculate all the corresponding FM amplitudes of angles, by inverting the output of memory or ROM, offset the input θ or both; and g. with the output being the inverted or not inverted output of either Sin(α) or Cos(β) memory (or ROM).

6. The method of performing digital frequency modulation (FM) as claimed in claim 5 wherein the carrier frequency parameter $$a = \frac{X_w \cdot f_s - X_s \cdot f_w}{f_w - f_s}$$

and the frequency variation parameter $$b = 2^n T\left(\frac{f_w - f_s}{X_w - X_s}\right)$$

($X_s$ is the criterion level of a sync signal, $f_s$ is the frequency of a sync signal, $X_w$ is the criterion level of a white signal, $f_w$ is the frequency of the white signal, n is the number of bits used, and T is the period of a clock cycle).

7. The method of performing digital frequency modulation (FM) as claimed in claim 5 wherein said different operating systems involve NTSC, PAL, VHS and SVHS recording and playing systems.

8. The method of performing digital frequency modulation (FM) as claimed in claim 5 wherein the memory or ROM of Sin($\alpha$), $\theta \leq \alpha \leq \pi/2$, is used to obtain corresponding amplitudes of all radian of $\theta$ in the following manner which can be implemented by inverting the output, offset the input $\theta$ or both at the same time:

as $0 \leq \theta \leq \pi/2$, A=Sin$\theta$=Sin$\alpha$ as $\pi/2 \leq \theta \leq \pi$, A=Sin$\theta$=Sin($\pi-\alpha$)=Sin$\alpha$ as $\pi \leq \theta \leq 3/2\pi$, A=Sin$\theta$=-Sin($\theta-\pi$)=-Sin$\alpha$ as $3/2\pi \leq \theta \leq 2\pi$, A=Sin$\theta$=-Sin($2\pi-\theta$)=-Sin$\alpha$ whereby all the amplitudes A corresponding to radian $\theta$ can be expressed by Sin$\alpha$ memory or ROM; wherein $\theta \leq \alpha \leq \pi/2$ and A stands for an amplitude; thus, Sin$\alpha$ memory or ROM can be shrunk into a quarter.

9. The method of performing digital frequency modulation (FM) as claimed in claim 8 comprising using the symmetric of sinusoid instead of using the $\theta$ as the input address to get the corresponding amplitude, using the amplitude as the address to get the $\theta$, and exploiting the symmetric of sinusoid to represent the 0 to $2\pi$ to $\pi/2$ to save the memory or ROM size.

10. The method of performing digital frequency modulation (FM) as claimed in claim 5 wherein said memory or ROM of Cos($\beta$), $0 \leq (\beta) \leq \pi/2$, is used to obtain corresponding amplitudes of all radian of $\theta$ in the following manner which can be implemented by inverting the output, offset the input $\theta$ or both at the same time:

as $0 \leq \theta \leq \pi/2$, A'=Cos$\theta$=Cos($\beta$)

as $\pi/2 \leq \theta \leq \pi$, A'=Cos$\theta$=-Cos($\pi-\theta$)=-Cos($\beta$)

as $\pi \leq \theta \leq 3/2\pi$, A'=Cos$\theta$=-Cos($\theta-\pi$)=-Cos($\beta$)

as $3/2\pi \leq \theta \leq 2\pi$, A'=Cos$\theta$=Cos($2\pi-\theta$)=Cos($\beta$)

whereby the amplitudes of all corresponding $\theta$ can be expressed by Cos($\beta$) memory or ROM, wherein $0 \leq (\beta) \leq \pi/2$ and A' stands for an amplitude; and by the same means Cos($\beta$) memory or ROM can be shrunk into a quarter.

11. The method of performing digital frequency modulation (FM) as claimed in claim 9 comprising using the symmetric of cosine instead of using the $\theta$ as the input address to get the corresponding amplitude, using the amplitude as the address to get the $\theta$, and exploiting the symmetric of sinusoid to represent the 0 to $2\pi$ by only 0 to $\pi/2$ to save the memory or ROM size.

12. A device for performing digital frequency modulation (FM), comprising, in combination:

an analogue/digit (A/D) converter for converting an input signal into a first digital signal;

an adder to add a various carrier frequency parameter "a" to said first digital signal to obtain a second digital signal for each different operating system;

a multiplier to multiply said second digital signal by a various frequency variation parameter "b" assigned to each said different operating system to obtain a third digital signal;

a digital integrator to obtain VCO (voltage controlled oscillation) signals $\theta$;

a MEMORY or ROM for Sin($\alpha$) used to obtain a corresponding amplitude for only one quarter memory size, 0 to $\pi/2$, to represent 0 to $2\pi$; and a MEMORY or ROM for Cos($\beta$) used to obtain a corresponding amplitude for all radian only one quarter memory size, 0 to $\pi/2$, to represent 0 to $2\pi$, wherein the output is the output of the inverted or not inverted output of either Sin($\alpha$) or Cos($\beta$) memory (or ROM).

13. The device for performing digital frequency modulation (FM) as claimed in claim 12 wherein said carrier parameter $$a = \frac{X_w \cdot f_s - X_s \cdot f_w}{f_w - f_s}$$

and said variation parameter $$b = 2^n T\left(\frac{f_w - f_s}{X_w - X_s}\right)$$

and $X_s$ is the criterion level of a sync signal;

$f_s$ is the frequency of a sync signal;

$X_w$ is the criterion level of a white signal;

$f_w$ is the frequency of said white signal;

n is the number of bits used; and

T is the period of a clock cycle.

14. The device for performing digital frequency modulation (FM) as claimed in claim 12 wherein said different operating systems involve NTSC, PAL, VHS and SVHS recording and playing systems.

* * * * *